United States Patent
Kagawa et al.

(10) Patent No.: US 12,424,389 B2
(45) Date of Patent: Sep. 23, 2025

(54) SEMICONDUCTOR DEVICE AND CAPACITANCE DEVICE

(71) Applicant: Murata Manufacturing Co., Ltd., Nagaokakyo (JP)

(72) Inventors: Takeshi Kagawa, Nagaokakyo (JP); Masatomi Harada, Nagaokakyo (JP); Hiroshi Matsubara, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 589 days.

(21) Appl. No.: 17/859,128

(22) Filed: Jul. 7, 2022

(65) Prior Publication Data

US 2022/0336155 A1    Oct. 20, 2022

Related U.S. Application Data

(63) Continuation of application No. PCT/JP2021/001714, filed on Jan. 19, 2021.

(30) Foreign Application Priority Data

Jan. 20, 2020   (JP) .................................. 2020-006848

(51) Int. Cl.
*H01G 4/33* (2006.01)
*H01G 4/10* (2006.01)
(Continued)

(52) U.S. Cl.
CPC ................. *H01G 4/33* (2013.01); *H01G 4/10* (2013.01); *H01G 4/1209* (2013.01);
(Continued)

(58) Field of Classification Search
CPC .......... H01G 4/33; H01G 4/10; H01G 4/1209; H01G 4/1254; H01G 4/252; H01G 4/306;
(Continued)

(56) References Cited

U.S. PATENT DOCUMENTS 6,885,081 B2 * 4/2005 Morimoto ............ H10D 84/215
257/532
7,078,785 B2 * 7/2006 Ciancio .................. H10D 1/696
257/532
(Continued)

FOREIGN PATENT DOCUMENTS

JP   H0547586 A    2/1993
JP   200579513 A    3/2005
(Continued)

OTHER PUBLICATIONS

International Search Report in PCT/JP2021/001714, mailed Mar. 23, 2021, 4 pages.

*Primary Examiner* — Victor A Mandala

(74) *Attorney, Agent, or Firm* — ArentFox Schiff LLP

(57) ABSTRACT

A semiconductor device includes a semiconductor substrate having first and second main surfaces that oppose each other in a thickness direction, and a circuit layer disposed on the first main surface. The circuit layer includes a first electrode layer on a side of the semiconductor substrate, a second electrode layer that faces the first electrode layer, a dielectric layer disposed between the electrode layers, and a first outer electrode electrically connected to the first electrode layer through an opening in the dielectric layer. An end portion of the dielectric layer on a side of the first region is in contact with the first electrode layer, and in the dielectric layer, a size of the end portion in the thickness direction is smaller than a size of an inter-electrode portion between the first and second electrode layers in the thickness direction.

21 Claims, 7 Drawing Sheets

(51) Int. Cl.
  *H01G 4/12* (2006.01)
  *H01G 4/252* (2006.01)
  *H01G 4/30* (2006.01)
  *H10D 1/68* (2025.01)

(52) U.S. Cl.
  CPC ........... *H01G 4/1254* (2013.01); *H01G 4/252* (2013.01); *H01G 4/306* (2013.01); *H10D 1/692* (2025.01)

(58) Field of Classification Search
  CPC .......... H01G 4/08; H01G 4/1272; H01G 4/20; H10D 1/692; H01L 21/768; H01L 23/522; H01L 23/532
  See application file for complete search history.

(56) References Cited

U.S. PATENT DOCUMENTS

| | | | |
|---|---|---|---|
| 9,761,655 B1 | 9/2017 | Ando et al. | |
| 2003/0011043 A1* | 1/2003 | Roberts | H10D 1/68 |
| | | | 257/532 |
| 2005/0082589 A1 | 4/2005 | Noda et al. | |
| 2005/0139956 A1* | 6/2005 | Ohkubo | H10D 1/68 |
| | | | 257/532 |
| 2008/0145996 A1 | 6/2008 | Nomura et al. | |
| 2010/0155889 A1* | 6/2010 | Cho | H10D 1/692 |
| | | | 257/532 |
| 2011/0044011 A1 | 2/2011 | Ohtsuka et al. | |
| 2012/0199946 A1* | 8/2012 | Kageyama | H01L 21/76816 |
| | | | 257/532 |
| 2016/0035817 A1* | 2/2016 | Hsu | H01L 21/283 |
| | | | 257/532 |
| 2018/0040422 A1* | 2/2018 | Shin | H01G 4/008 |
| 2018/0061581 A1* | 3/2018 | Lee | H01G 4/33 |
| 2020/0027946 A1* | 1/2020 | Liu | H01L 21/76877 |
| 2020/0066622 A1* | 2/2020 | Jain | H01L 23/49822 |
| 2020/0082989 A1* | 3/2020 | Kagawa | H10D 1/684 |
| 2021/0020738 A1* | 1/2021 | Kagawa | H10D 1/712 |
| 2021/0027951 A1* | 1/2021 | Harada | H10D 1/68 |
| 2021/0057517 A1* | 2/2021 | Chen | H01L 21/0217 |

FOREIGN PATENT DOCUMENTS

| | | |
|---|---|---|
| JP | 2005191182 A | 7/2005 |
| JP | 2008153497 A | 7/2008 |
| JP | 2011044613 A | 3/2011 |
| JP | 2016219588 A | 12/2016 |
| WO | 2019026771 A1 | 2/2019 |

* cited by examiner

SEMICONDUCTOR DEVICE AND CAPACITANCE DEVICE

CROSS REFERENCE TO RELATED APPLICATIONS

This application is a continuation of PCT Application No. PCT/JP2021/001714, filed Jan. 19, 2021, which claims priority to Japanese Patent Application No. 2020-006848, filed Jan. 20, 2020, the entire contents of each of which are hereby incorporated in their entirety.

TECHNICAL FIELD

The present invention relates to a semiconductor device and a capacitance device.

BACKGROUND

As a typical capacitor element used in a semiconductor integrated circuit, an MIM (Metal Insulator Metal) capacitor is known, for example. The MIM capacitor has a parallel-plate type structure in which a dielectric layer is sandwiched between a lower electrode and an upper electrode.

For example, Japanese Unexamined Patent Application Publication No. 2011-44613 (hereinafter "Patent Document 1") discloses an electronic component including a circuit element formed on a substrate, an electrode layer to be connected to the circuit element, a protection layer covering the electrode layer, and a terminal electrode connected to the electrode layer using a via conductor penetrating through the protection layer and provided on an upper portion of the protection layer. Moreover, one end of the terminal electrode is positioned on a side wall surface of the protection layer.

In the electronic component described in Patent Document 1, when a thickness of the dielectric layer becomes larger, for example, 0.1 μm or more, internal stress of the dielectric layer also increases. Consequently, detachment can occur between the dielectric layer and the lower electrode in the vicinity of an opening provided in the dielectric layer. As a result, the characteristics of the capacitor element are adversely affected, and reliability is lowered. Further, when detachment occurs between the dielectric layer and the lower electrode in the vicinity of the opening of the dielectric layer, detachment can also occur between a first electrode connected to the lower electrode and the dielectric layer.

SUMMARY OF THE INVENTION

Accordingly, it is an object of the present invention to provide a semiconductor device that prevents detachment of a dielectric layer. Further, it is another object of the present invention to provide a capacitance device that prevents detachment of a dielectric layer.

In an exemplary embodiment, a semiconductor device includes a semiconductor substrate having a first main surface and a second main surface opposite to each other in a thickness direction and a circuit layer provided on the first main surface of the semiconductor substrate. The circuit layer includes a first electrode layer provided on a side of the semiconductor substrate, a second electrode layer provided to face the first electrode layer, a dielectric layer provided between the first electrode layer and the second electrode layer in a sectional view, and a first outer electrode electrically connected to the first electrode layer through a first region in which the dielectric layer is not provided. Moreover, an end portion of the dielectric layer on a side of the first region is in contact with the first electrode layer at a surface on a side of the first electrode layer, and in the dielectric layer, a size of the end portion in the thickness direction is smaller than a size of an inter-electrode portion positioned between the first electrode layer and the second electrode layer in the thickness direction.

In another exemplary embodiment, a capacitance device is provided that includes a substrate having a first main surface and a second main surface opposite to each other in a thickness direction and a circuit layer provided on the first main surface of the substrate. In this aspect, the circuit layer includes a first electrode layer provided on a side of the substrate, a second electrode layer provided to face the first electrode layer, a dielectric layer provided between the first electrode layer and the second electrode layer in a sectional view, and a first outer electrode electrically connected to the first electrode layer through a first region in which the dielectric layer is not provided. An end portion of the dielectric layer on a side of the first region is in contact with the first electrode layer at a surface on a side of the first electrode layer, and in the dielectric layer, a size of the end portion in the thickness direction is smaller than a size of an inter-electrode portion positioned between the first electrode layer and the second electrode layer in the thickness direction.

According to the exemplary embodiments of the present invention, a semiconductor device is provided in which detachment of a dielectric layer is prevented. Further, according to exemplary embodiments of the present invention, a capacitance device is provided in which detachment of a dielectric layer is prevented.

DETAILED DESCRIPTION OF EMBODIMENTS

Hereinafter, a semiconductor device of the present invention and a capacitance device of the present invention will be described. It is noted that the exemplary aspects of the present invention are not limited to the following configurations, and can be appropriately changed without departing from the gist of the present invention. Further, combinations of multiple individual configurations described below are also included in the present invention.

Each embodiment described below is an example, and it is needless to say that partial replacement or combination of configurations described in different embodiments is possible. In the second exemplary embodiment and subsequent embodiments, a description of items common to the first exemplary embodiment will be omitted, and different points will mainly be described. In particular, similar functions and effects achieved with similar configurations will not be described one by one for each embodiment.

First Exemplary Embodiment

In an exemplary aspect, a semiconductor device is provided that includes a semiconductor substrate having a first main surface and a second main surface opposite to each other in a thickness direction and a circuit layer provided on the first main surface of the semiconductor substrate. The circuit layer includes a first electrode layer provided on a side of the semiconductor substrate, a second electrode layer provided to face the first electrode layer, a dielectric layer provided between the first electrode layer and the second electrode layer in a sectional view, and a first outer electrode electrically connected to the first electrode layer through a first region in which the dielectric layer is not provided. Moreover, an end portion of the dielectric layer on a side of the first region is in contact with the first electrode layer at a surface on a side of the first electrode layer, and in the dielectric layer, a size of the end portion in the thickness direction is smaller than a size of an inter-electrode portion positioned between the first electrode layer and the second electrode layer in the thickness direction. Further, in the exemplary semiconductor device described herein, the first region may be an opening provided in the dielectric layer, and the end portion of the dielectric layer may be an edge portion surrounding the opening. Further, in the exemplary semiconductor device described herein, in the end portion of the dielectric layer, a size on a side of the opening in the thickness direction may be smaller than a size on a side opposite to the opening in the thickness direction. Furthermore, in the exemplary semiconductor device described herein, in the dielectric layer, a size of the end portion in the thickness direction may continuously decrease toward a center of the opening. Such an example will be described below as a semiconductor device of first exemplary embodiment.

Figure 1:
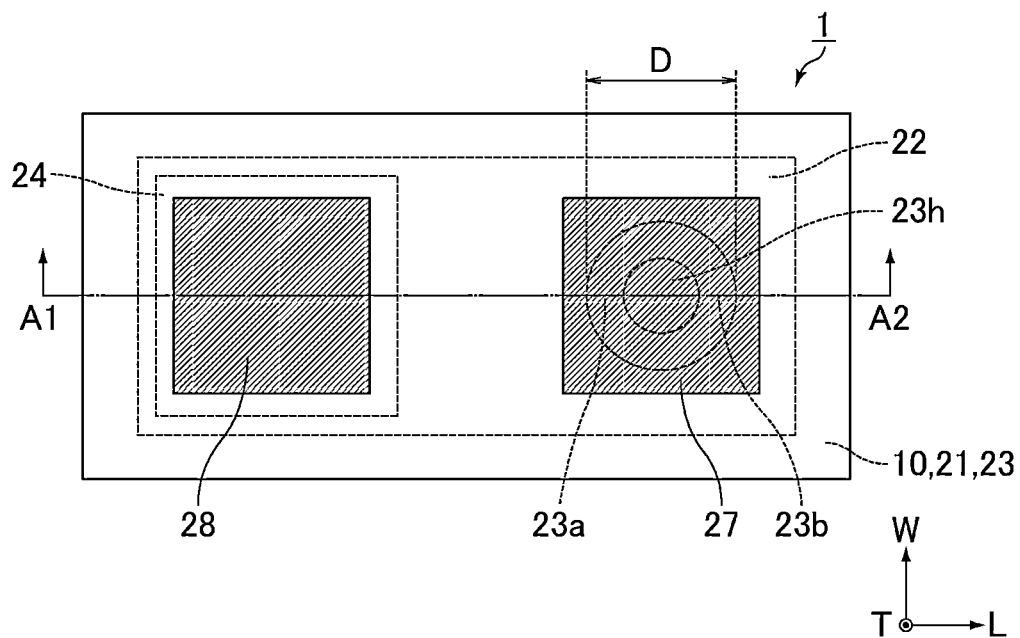
FIG. 1 is a schematic plan view of a semiconductor device of a first exemplary embodiment.
Figure 2:
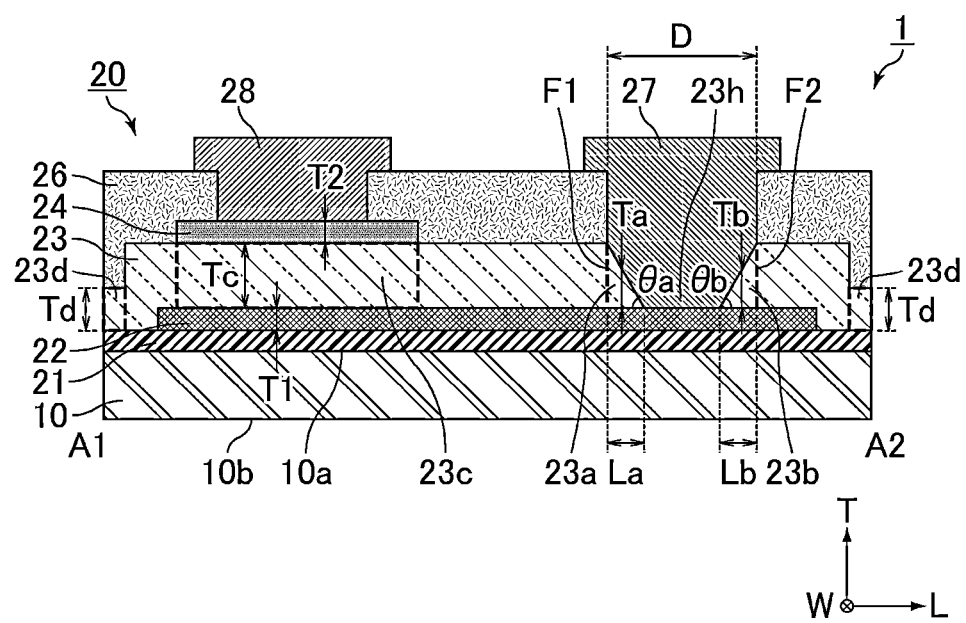
FIG. 2 is a schematic sectional view of a portion corresponding to a line segment A1-A2 in FIG. 1.

FIG. 1 is a schematic plan view of the semiconductor device of a first exemplary embodiment. FIG. 2 is a schematic sectional view of a portion corresponding to a line segment A1-A2 in FIG. 1.

In the present description, a length direction, a width direction, and a thickness direction of a semiconductor device are directions determined with an arrow L, an arrow W, and an arrow T, respectively, as illustrated in, for example, FIG. 1 and FIG. 2. Here, a length direction L, a width direction W, and a thickness direction T are orthogonal to each other.

As illustrated in FIG. 1 and FIG. 2, a semiconductor device 1 includes a semiconductor substrate 10 and a circuit layer 20.

As shown, the semiconductor substrate 10 has a first main surface 10a and a second main surface 10b opposite to each other in the thickness direction T. The first main surface 10a and the second main surface 10b face each other in the thickness direction T.

Examples of constituent materials of the semiconductor substrate 10 include semiconductors, such as Si (silicon) and SiGe (silicon germanium) and the like.

Electric resistivity of the semiconductor substrate 10 is preferably $10^{-5}$ Ω·cm or more and $10^5$ Ω·cm or less, for example.

Moreover, a size of the semiconductor substrate 10 in the length direction L is preferably 200 μm or more and 600 μm or less, for example.

A size of the semiconductor substrate 10 in the width direction W is preferably 100 μm or more and 300 μm or less, for example.

A size of the semiconductor substrate 10 in the thickness direction T is preferably 100 μm or more and 250 μm or less, for example.

The circuit layer 20 is provided on the first main surface 10a of the semiconductor substrate 10. In the exemplary aspect, the circuit layer 20 includes an insulation layer 21, a first electrode layer 22, a dielectric layer 23, a second electrode layer 24, a protection layer 26, a first outer electrode 27, and a second outer electrode 28.

In an exemplary aspect, a size of the circuit layer 20 in the thickness direction T is preferably 30 μm or more and 70 μm or less. The size of the circuit layer 20 in the thickness direction T is determined by a size from a surface of the insulation layer 21 on a side of the semiconductor substrate 10, to a surface positioned furthest on a side opposite to the semiconductor substrate 10 among the outermost surfaces of the first outer electrode 27 and the second outer electrode 28.

The insulation layer 21 is provided on the entire first main surface 10a of the semiconductor substrate 10. However, it is noted that the insulation layer 21 may be provided on part of the first main surface 10a of the semiconductor substrate 10, but needs to be provided in a region overlapping with the first electrode layer 22. The insulation layer 21 may be provided on part of the first main surface 10a of the semiconductor substrate 10 as follows, for example. An insulation layer on the entire first main surface 10a of the semiconductor substrate 10 is formed by oxidizing the first main surface 10a of the semiconductor substrate 10 with a thermal oxidization method, or by forming a film with a sputtering method or a chemical vapor deposition (CVD) method. Then, part of the insulation layer is removed with an etching method, for example.

In exemplary aspects, examples of the constituent materials of the insulation layer 21 include, for example, SiO, $SiO_2$ (both are silicon oxide), SiN (silicon nitride), $Al_2O_3$ (aluminum oxide), $HfO_2$ (hafnium oxide), $Ta_2O_5$ (tantalum oxide), and $ZrO_2$ (zirconium oxide).

Moreover, the insulation layer 21 may have a single-layer structure or a multi-layer structure including a plurality of layers made of the materials described above.

A size of the insulation layer 21 in the thickness direction T is preferably 0.5 μm or more and 3 μm or less, for example.

The first electrode layer 22 is provided to the circuit layer 20 on the side of the semiconductor substrate 10, here, on a surface of the insulation layer 21 on a side opposite to the semiconductor substrate 10 as shown in FIG. 2.

The first electrode layer 22 may be provided up to a position separated from an end portion of the semiconductor substrate 10. More specifically, an end portion of the first electrode layer 22 may be positioned at an inner side portion of the end portion of the semiconductor substrate 10. In a plan view as illustrated in FIG. 1, a distance between the end portion of the first electrode layer 22 and the end portion of the semiconductor substrate 10 is preferably 5 μm or more and 30 μm or less.

In exemplary aspects, examples of the constituent materials of the first electrode layer 22 include metals such as Al (aluminum), Si (silicon), Cu (copper), Ag (silver), Au (gold), Ni (nickel), Cr (chromium), and Ti (titanium). The constituent material of the first electrode layer 22 may be an alloy containing at least one of the metals described above, and specific examples thereof include, for example, AlSi (aluminum-silicon alloy), AlCu (aluminum-copper alloy), and AlSiCu (aluminum-silicon-copper alloy).

Moreover, the first electrode layer 22 may have a single-layer structure, or a multi-layer structure including a plurality of conductive layers made of the materials described above.

A size T1 of the first electrode layer 22 in the thickness direction T is preferably 0.3 μm or more and 10 μm or less, and more preferably 0.5 μm or more and 5 μm or less.

As further shown, the dielectric layer 23 is provided between the first electrode layer 22 and the second electrode layer 24 in a sectional view as illustrated in FIG. 2. Further, the dielectric layer 23 is provided to cover a portion of the first electrode layer 22 except for an opening 23h, and an end portion of the dielectric layer 23 is also provided on the surface of the insulation layer 21 from the end portion of the first electrode layer 22 to the end portion of the semiconductor substrate 10.

In exemplary aspects, examples of the constituent materials of the dielectric layer 23 include, for example, SiN (silicon nitride), $SiO_2$ (silicon oxide), SiON (silicon oxynitride), $Al_2O_3$ (aluminum oxide), $HfO_2$ (hafnium oxide), and $Ta_2O_5$ (tantalum oxide). In particular, the dielectric layer 23 preferably contains SiN (silicon nitride).

Details of a structure of the dielectric layer 23 will be described below.

The second electrode layer 24 is provided to face the first electrode layer 22. More specifically, the second electrode layer 24 is provided on a surface of the dielectric layer 23 on the side opposite to the semiconductor substrate 10, and faces the first electrode layer 22 with the dielectric layer 23 interposed therebetween.

In exemplary aspects, examples of the constituent materials of the second electrode layer 24 include metals such as Al (aluminum), Si (silicon), Cu (copper), Ag (silver), Au (gold), Ni (nickel), Cr (chromium), and Ti (titanium). The constituent material of the second electrode layer 24 may be an alloy containing at least one of the metals described above, and specific examples thereof include, for example, AlSi (aluminum-silicon alloy), AlCu (aluminum-copper alloy), and AlSiCu (aluminum-silicon-copper alloy).

Moreover, the second electrode layer 24 may have a single-layer structure, or a multi-layer structure including a plurality of conductive layers made of the materials described above.

In an exemplary aspect, a size T2 of the second electrode layer 24 in the thickness direction T is preferably 0.3 μm or more and 10 μm or less, and more preferably 0.5 μm or more and 5 μm or less.

In the semiconductor device 1, the first electrode layer 22, the dielectric layer 23, and the second electrode layer 24 form a capacitor element. More specifically, capacitance of the capacitor element is formed in a region where the first electrode layer 22, the dielectric layer 23, and the second electrode layer 24 overlap with each other. The capacitor element may be a stack type as illustrated in FIG. 2 or a trench type.

The protection layer 26 is provided on the surface of the dielectric layer 23 on the side opposite to the semiconductor substrate 10, and extends to cover an end portion of the second electrode layer 24. Further, in the protection layer 26, an opening is provided at each of a position overlapping with the opening 23h (i.e., opening overlapping with the first electrode layer 22) of the dielectric layer 23, and a position overlapping with the second electrode layer 24. With the protection layer 26 being provided, the capacitor element, particularly the dielectric layer 23, is sufficiently protected from moisture.

Examples of the constituent materials of the protection layer 26 include resins such as a polyimide resin, a polybenzoxazole resin, a benzocyclobutene resin, and a resin in a solder resist.

Moreover, a size of the protection layer 26 in the thickness direction T is preferably 1 μm or more and 20 μm or less.

As further shown, the first outer electrode 27 is electrically connected to the first electrode layer 22. More specifically, openings respectively provided to the dielectric layer 23 and the protection layer 26 communicate with each other and extend along the thickness direction T, and the first outer electrode 27 is electrically connected to the first electrode layer 22 through the openings. Further, the first outer electrode 27 is separated from the second electrode layer 24 on a plane along the length direction L and the width direction W, and thus, is not electrically connected to the second electrode layer 24. Furthermore, the first outer electrode 27 is drawn out to a position separated from the second outer electrode 28 on a surface of the circuit layer 20 on the side opposite to the semiconductor substrate 10.

In exemplary aspects, the first outer electrode 27 may have a single-layer structure or a multi-layer structure.

In an aspect where the first outer electrode 27 has a single-layer structure, examples of the constituent materials thereof include, for example, Au (gold), Ag (silver), Cu (copper), Pd (palladium), Ni (nickel), Ti (titanium), Al (aluminum), and an alloy containing at least one of these metals.

In an aspect where the first outer electrode 27 has a multi-layer structure, the first outer electrode 27 may include a seed layer, a first plating layer, and a second plating layer in order from the side of the semiconductor substrate 10.

An example of the seed layer of the first outer electrode 27 is a multilayer body (Ti/Cu) of a conductive layer made of Ti (titanium) and a conductive layer made of Cu (copper).

Examples of constituent materials of the first plating layer of the first outer electrode 27 include, for example, Ni (nickel).

Examples of constituent materials of the second plating layer of the first outer electrode 27 include, for example, Au (gold) and Sn (tin).

The second outer electrode 28 is electrically connected to the second electrode layer 24. More specifically, an opening provided in the protection layer 26 extends along the thickness direction T, and the second outer electrode 28 is electrically connected to the second electrode layer 24 through the opening. Further, the second outer electrode 28 is separated from the first electrode layer 22 on a plane along the length direction L and the thickness direction T, and thus, is not electrically connected to the first electrode layer 22. Furthermore, the second outer electrode 28 is drawn out to a position separated from the first outer electrode 27 on the surface of the circuit layer 20 on the side opposite to the semiconductor substrate 10.

Similarly, the second outer electrode 28 may have a single-layer structure or a multi-layer structure.

In an aspect where the second outer electrode 28 has a single-layer structure, examples of the constituent materials thereof include, for example, Au (gold), Ag (silver), Cu (copper), Pd (palladium), Ni (nickel), Ti (titanium), Al (aluminum), and an alloy containing at least one of these metals.

In an aspect where the second outer electrode 28 has a multi-layer structure, the second outer electrode 28 may include a seed layer, a first plating layer, and a second plating layer in order from the side of the semiconductor substrate 10.

An example of the seed layer of the second outer electrode 28 is a multilayer body (Ti/Cu) of a conductive layer made of Ti (titanium) and a conductive layer made of Cu (copper).

Examples of constituent materials of the first plating layer of the second outer electrode 28 include, for example, Ni (nickel).

Moreover, examples of constituent materials of the second plating layer of the second outer electrode 28 include, for example, Au (gold) and Sn (tin).

It is noted that the constituent material of the first outer electrode 27 and the constituent material of the second outer electrode 28 may be the same as each other or may be different from each other.

Hereinafter, the structure of the dielectric layer 23 will be described in detail.

As illustrated in FIG. 1 and FIG. 2, the opening 23h provided to the dielectric layer 23 can be described to be the first region in which the dielectric layer 23 is not provided.

An edge portion (e.g., an inner peripheral edge portion) surrounding the opening 23h of the dielectric layer 23 has an annular shape in a plan view as illustrated in FIG. 1, and part of the edge portion is illustrated as an end portion 23a and an end portion 23b of the dielectric layer 23 on a side of the opening 23h in a sectional view as illustrated in FIG. 2.

As illustrated in FIG. 2, the end portion 23a of the dielectric layer 23 on the side of the opening 23h is in contact with the first electrode layer 22 at a surface on a side of the first electrode layer 22.

In the dielectric layer 23, a size Ta of the end portion 23a in the thickness direction T is smaller than a size Tc of an inter-electrode portion 23c in the thickness direction T positioned between the first electrode layer 22 and the second electrode layer 24 as shown in FIG. 2. In other words, the end portion 23a of the dielectric layer 23 refers to a portion present on a side of the first outer electrode 27 relative to a position indicated by a dotted line F1 in a sectional view as illustrated in FIG. 2, that is, a portion in which the size Ta in the thickness direction T is smaller than the size Tc. In the semiconductor device 1 in FIG. 2, the end portion 23a of the dielectric layer 23 overlaps with the first outer electrode 27 in the opening 23h.

The size Ta of the end portion 23a of the dielectric layer 23 in the thickness direction T is smaller than the size Tc of the inter-electrode portion 23c in the thickness direction T, and consequently lowered is internal stress of the end portion 23a at which detachment is likely to begin. Consequently, in the vicinity of the opening 23h of the dielectric layer 23, detachment between the end portion 23a of the dielectric layer 23 and the first electrode layer 22 is prevented. Similarly, detachment between the end portion 23a of the dielectric layer 23 and the first outer electrode 27 is also prevented. As described above, since the characteristics of the capacitor element do not deteriorate, a decrease in reliability is prevented.

In particular, in the end portion 23a of the dielectric layer 23, the size on the side of the opening 23h in the thickness direction T is smaller than the size on a side opposite to the opening 23h in the thickness direction T. As a result, internal stress is lowered at a tip end of the end portion 23a on the side of the opening 23h at which detachment is more likely to begin. Consequently, detachment of the dielectric layer 23 in the vicinity of the opening 23h is more reliably prevented.

As an end portion of the dielectric layer 23 on the side of the opening 23h, in addition to the end portion 23a, present is the end portion 23b facing the end portion 23a in a sectional view as illustrated in FIG. 2.

As illustrated in FIG. 2, the end portion 23b of the dielectric layer 23 on the side of the opening 23h is in contact with the first electrode layer 22 at the surface on the side of the first electrode layer 22.

As described above, in the dielectric layer 23, a size Tb of the end portion 23b in the thickness direction T is smaller than the size Tc of the inter-electrode portion 23c in the thickness direction T. In other words, the end portion 23b of the dielectric layer 23 refers to a portion present on the side of the first outer electrode 27 relative to a dotted line F2 in a sectional view as illustrated in FIG. 2, that is, a portion in which the size Tb in the thickness direction T is smaller than the size Tc. In the semiconductor device 1 in FIG. 2, the end portion 23b of the dielectric layer 23 overlaps with the first outer electrode 27 in the opening 23h.

The size Tb of the end portion 23b of the dielectric layer 23 in the thickness direction T is smaller than the size Tc of the inter-electrode portion 23c in the thickness direction T, and consequently internal stress is lowered in the end portion 23b at which detachment is likely to begin. Consequently, in the vicinity of the opening 23h of the dielectric layer 23, detachment between the end portion 23b of the dielectric layer 23 and the first electrode layer 22 is prevented. Similarly, detachment between the end portion 23b of the dielectric layer 23 and the first outer electrode 27 is also prevented. As described above, since the characteristics of the capacitor element do not deteriorate, a decrease in reliability is prevented.

In particular, in the end portion 23b of the dielectric layer 23, the size on the side of the opening 23h in the thickness direction T is smaller than the size on the side opposite to the opening 23h in the thickness direction T. As a result, internal stress is lowered at a tip end of the end portion 23b on the side of the opening 23h at which detachment is more likely to begin. Consequently, detachment of the dielectric layer 23 in the vicinity of the opening 23h is more reliably prevented.

In the semiconductor device 1 in FIG. 2, in the dielectric layer 23, both the size Ta of the end portion 23a in the thickness direction T and the size Tb of the end portion 23b in the thickness direction T are smaller than the size Tc of the inter-electrode portion 23c in the thickness direction T. However, in an alternative aspect, it is acceptable that either of the size Ta of the end portion 23a in the thickness direction T or the size Tb of the end portion 23b in the thickness direction T is smaller than the size Tc of the inter-electrode portion 23c in the thickness direction T. From a viewpoint of preventing detachment in the vicinity of the opening 23h of the dielectric layer 23, it is preferable that both the size Ta of the end portion 23a in the thickness direction T and the size Tb of the end portion 23b in the thickness direction T be smaller than the size Tc of the inter-electrode portion 23c in the thickness direction T.

First, the end portion 23a of the dielectric layer 23 will be described in detail.

As illustrated in FIG. 2, in the dielectric layer 23, the size Ta of the end portion 23a in the thickness direction T continuously decreases toward a center of the opening 23h. More specifically, the end portion 23a of the dielectric layer 23 is in contact with the first electrode layer 22, and a sectional shape of the end portion 23a of the dielectric layer 23 is a tapered shape, and is a so-called linearly tapered shape in an exemplary aspect.

Moreover, in an exemplary aspect of the end portion 23a of the dielectric layer 23, an inclination angle θa of the tapered shape is preferably 30° or more and 60° or less. The inclination angle θa of the tapered shape in the end portion 23a of the dielectric layer 23 refers to an angle formed by a side in contact with the first electrode layer 22 and a side in contact with the first outer electrode 27 in a sectional view as illustrated in FIG. 2.

Moreover, a distance La between a position at which the size of the tapered shape in the thickness direction T is zero and a position at which the size is maximum, in the length direction L from the second outer electrode 28 toward the first outer electrode 27, is preferably 50% or more of the size Tc of the inter-electrode portion 23c in the thickness direction T. Further, the distance La is preferably 200% or less of the size Tc of the inter-electrode portion 23c in the thickness direction T.

In addition, the distance La between a position at which the size of the tapered shape in the thickness direction T is zero and a position at which the size is maximum, in the length direction L from the second outer electrode 28 toward the first outer electrode 27, is preferably 1% or more of a diameter D of the opening 23h. Further, the distance La is preferably 50% or less of the diameter D of the opening 23h.

As illustrated in FIG. 1 and FIG. 2, the diameter D of the opening 23h of the dielectric layer 23 refers to the maximum diameter of the opening 23h.

As for the end portion 23a of the dielectric layer 23, a form in which the size Ta in the thickness direction T continuously decreases toward the center of the opening 23h may have a tapered shape described below, for example, other than the linearly tapered shape as illustrated in FIG. 2 as a sectional shape.

Figure 3:
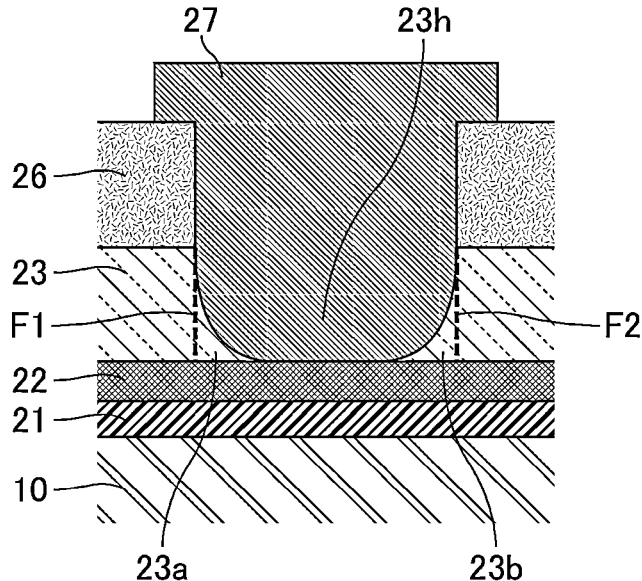
FIG. 3 is a schematic sectional view of another form example of an end portion of a dielectric layer in FIG. 2.

FIG. 3 is a schematic sectional view of another form example of the end portion of the dielectric layer in FIG. 2. In FIG. 3, the vicinity of the opening of the dielectric layer is illustrated. As illustrated in FIG. 3, the sectional shape of the end portion 23a of the dielectric layer 23 is a so-called exponentially tapered shape.

Figure 4:
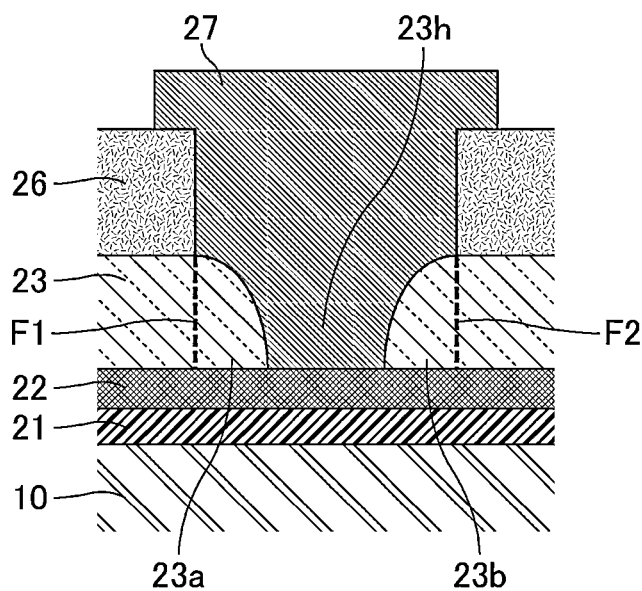
FIG. 4 is a schematic sectional view of still another form example of the end portion of the dielectric layer in FIG. 2.

FIG. 4 is a schematic sectional view of still another form example of the end portion of the dielectric layer in FIG. 2. In FIG. 4, the vicinity of the opening of the dielectric layer is illustrated. As illustrated in FIG. 4, the sectional shape of the end portion 23a of the dielectric layer 23 is a so-called parabolically tapered shape.

Next, the end portion 23b of the dielectric layer 23 will be described in detail.

As illustrated in FIG. 2, in the dielectric layer 23, the size Tb of the end portion 23b in the thickness direction T continuously decreases toward the center of the opening 23h. More specifically, the end portion 23b of the dielectric layer 23 is in contact with the first electrode layer 22, and a sectional shape of the end portion 23b of the dielectric layer 23 is a tapered shape, and is a so-called linearly tapered shape in an exemplary aspect.

In an exemplary aspect, an inclination angle θb of the tapered shape is preferably 30° or more and 60° or less. The inclination angle θb of the tapered shape in the end portion 23b of the dielectric layer 23 refers to an angle formed by a side in contact with the first electrode layer 22 and a side in contact with the first outer electrode 27 in a sectional view as illustrated in FIG. 2.

Moreover, a distance Lb between a position at which the size of the tapered shape in the thickness direction T is zero and a position at which the size is maximum, in the length direction L from the second outer electrode 28 toward the first outer electrode 27, is preferably 50% or more of the size Tc of the inter-electrode portion 23c in the thickness direction T. Further, the distance Lb is preferably 200% or less of the size Tc of the inter-electrode portion 23c in the thickness direction T.

Yet further, in the exemplary aspect, the distance Lb between a position at which the size of the tapered shape in the thickness direction T is zero and a position at which the size is maximum, in the length direction L from the second outer electrode 28 toward the first outer electrode 27, is preferably 1% or more of the diameter D of the opening 23h. Further, the distance Lb is preferably 50% or less of the diameter D of the opening 23h.

As for the end portion 23b of the dielectric layer 23, a form in which the size Tb in the thickness direction T continuously decreases toward the center of the opening 23h may have an exponentially tapered shape as illustrated in FIG. 3 or a parabolically tapered shape as illustrated in FIG. 4, for example, other than the linearly tapered shape as illustrated in FIG. 2 as a sectional shape.

In order to ensure the connection between the first electrode layer 22 and the first outer electrode 27, in the dielectric layer 23, a sum (La+Lb) of the distance La and the distance Lb is smaller than the diameter D of the opening 23h.

In the dielectric layer 23, a size Td of an outer peripheral edge portion 23d positioned in an outer peripheral edge of the circuit layer 20 in the thickness direction T is preferably smaller than the size Tc of the inter-electrode portion 23c in the thickness direction T. In the outer peripheral edge of the circuit layer 20, detachment may occur between the outer peripheral edge portion 23d of the dielectric layer 23 and the insulation layer 21. Whereas, as described above, since the size Td of the outer peripheral edge portion 23d of the dielectric layer 23 in the thickness direction T is small, internal stress in the outer peripheral edge portion 23d of the dielectric layer 23 is lowered. Consequently, in the outer peripheral edge of the circuit layer 20, detachment between the outer peripheral edge portion 23d of the dielectric layer 23 and the insulation layer 21 is prevented.

According to an exemplary aspect, the size Tc of the inter-electrode portion 23c of the dielectric layer 23 in the thickness direction T may be 1 μm or more. In the past, when a size of an inter-electrode portion of a dielectric layer in a thickness direction is increased to, for example, 0.1 μm or more in order to control capacitance of a capacitor element, internal stress of the dielectric layer increases. This makes it likely that detachment in the vicinity of an opening of the dielectric layer occurs. Further, according to the study by the present inventors, it has been found that when the size of the inter-electrode portion of the dielectric layer in the thickness direction is set to 1 μm or more, detachment in the vicinity of the opening of the dielectric layer remarkably occurs. Whereas, in the semiconductor device 1, as described above, since internal stress in the end portion 23a and the end portion 23b of the dielectric layer 23 is small, in an aspect where the size Tc of the inter-electrode portion 23c of the dielectric layer 23 in the thickness direction T is large, specifically, even in an aspect where the size Tc of the inter-electrode portion 23c of the dielectric layer 23 in the thickness direction T is 1 μm or more, detachment in the vicinity of the opening 23h of the dielectric layer 23 is prevented.

The size Tc of the inter-electrode portion 23c of the dielectric layer 23 in the thickness direction T may be equal to or larger than the size T1 of the first electrode layer 22 in the thickness direction T or the size T2 of the second electrode layer 24 in the thickness direction T. According to the study by the present inventors, it has been found that in the past, when a size of an inter-electrode portion of a dielectric layer in a thickness direction is equal to or larger than a size of a first electrode layer in the thickness direction or a size of a second electrode layer in the thickness direction, internal stress of the dielectric layer remarkably increases, and thus detachment in the vicinity of an opening of the dielectric layer remarkably occurs. Whereas, in the semiconductor device 1 of the exemplary embodiment, as described above, since internal stress in the end portion 23a and the end portion 23b of the dielectric layer 23 is small, even when the size Tc of the inter-electrode portion 23c of the dielectric layer 23 in the thickness direction T is equal to or larger than the size T1 of the first electrode layer 22 in the thickness direction T or the size T2 of the second electrode layer 24 in the thickness direction T, detachment in the vicinity of the opening 23h of the dielectric layer 23 is prevented.

A size and an angle of the dielectric layer 23, the diameter of the opening 23h of the dielectric layer 23, a size of the first electrode layer 22, and a size of the second electrode layer 24 may be measured as follows. First, a position is confirmed where the diameter D of the opening 23h of the dielectric layer 23 is maximum in a plan view as illustrated in FIG. 1, and then a section obtained by cutting at the position as illustrated in FIG. 2 is analyzed with, for example, a scanning electron microscope (SEM) or a transmission electron microscope (TEM). It is noted that the size Tc of the inter-electrode portion 23c of the dielectric layer 23 in the thickness direction T is determined as a mean value of measured values at five positions in a section as illustrated in FIG. 2.

Moreover, in an exemplary aspect, in the semiconductor device 1 of the exemplary embodiment, a moisture-resistant protection layer may be provided between the dielectric layer 23 and the protection layer 26 and between the second electrode layer 24 and the protection layer 26. More specifically, there may be provided a moisture-resistant protection layer extending from the surface of the dielectric layer 23 on the side opposite to the semiconductor substrate 10 to cover the end portion of the second electrode layer 24. In the case above, to the moisture-resistant protection layer, openings are respectively provided at a position overlapping with the openings of the dielectric layer 23 and the protection layer 26 (e.g., openings overlapping with the first electrode layer 22), and a position overlapping with the opening of the protection layer 26 (e.g., opening overlapping with the second electrode layer 24). With the moisture-resistant protection layer being provided, the moisture resistance property of the capacitor element, in particular, of the dielectric layer 23 is enhanced.

Examples of the constituent materials of the moisture-resistant protection layer include, for example, SiN (silicon nitride) and $SiO_2$ (silicon oxide).

In the semiconductor device 1, an additional protection layer can be provided other than the protection layer 26, extending from a surface of the protection layer 26 on the side opposite to the semiconductor substrate 10 to cover an end portion of the first outer electrode 27 and an end portion of the second outer electrode 28. In the case above, to the additional protection layer, openings are respectively provided at a position exposing part of the first outer electrode 27 and a position exposing part of the second outer electrode 28. With the additional protection layer being provided, it is possible that solder is reliably brought into contact with each of the first outer electrode 27 and the second outer electrode 28 through the openings provided to the additional protection layer, when mounting the semiconductor device 1 on a wiring substrate.

Examples of the constituent materials of the additional protection layer include resins such as a polyimide resin, a polybenzoxazole resin, a benzocyclobutene resin, and a resin in a solder resist.

The semiconductor device 1 in FIG. 2 is manufactured with the following method, for example. FIGS. 5-11 are schematic sectional views for describing an example of a method for manufacturing the semiconductor device of the first exemplary embodiment.

<Formation of Insulation Layer>

Figure 5:
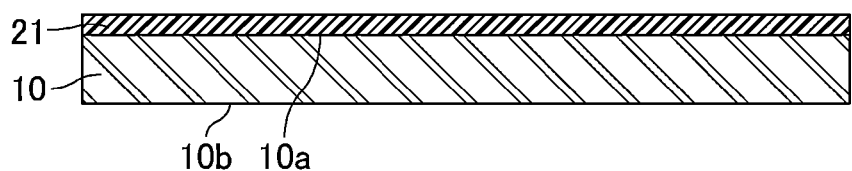
FIG. 5 is a schematic sectional view for describing an example of a method for manufacturing the semiconductor device of the first exemplary embodiment.

As illustrated in FIG. 5, the insulation layer 21 is formed on the first main surface 10a of the semiconductor substrate 10 with a thermal oxidization method, a sputtering method, or a chemical vapor deposition method, for example.

<Formation of First Electrode Layer>

Figure 6:
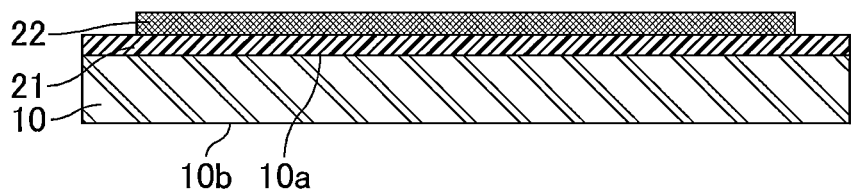
FIG. 6 is a schematic sectional view for describing an example of a method for manufacturing the semiconductor device of the first exemplary embodiment.

A conductive layer made of the constituent material of the first electrode layer 22 is formed on the surface of the insulation layer 21 on the side opposite to the semiconductor substrate 10 with a sputtering method, for example. Thereafter, the first electrode layer 22 is formed as illustrated in FIG. 6 by patterning the conductive layer with a combination of a photolithography method and an etching method.

More specifically, the first electrode layer 22 is formed up to a position separated from the end portion of the semiconductor substrate 10.

<Formation of Dielectric Layer>

Figure 7:
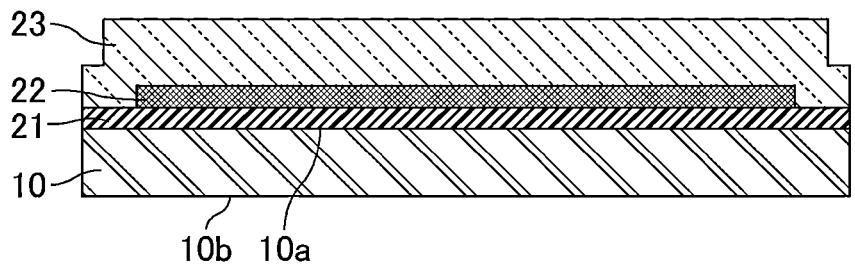
FIG. 7 is a schematic sectional view for describing an example of a method for manufacturing the semiconductor device of the first exemplary embodiment.

As illustrated in FIG. 7, the dielectric layer 23 is formed to cover the first electrode layer 22 with a sputtering method or a chemical vapor deposition method, for example.

<Formation of Second Electrode Layer>

Figure 8:
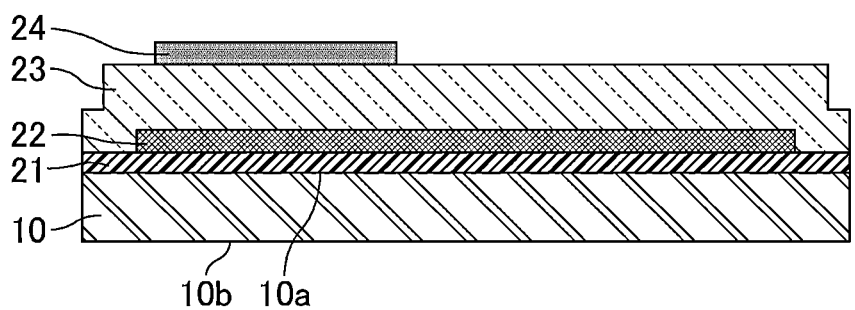
FIG. 8 is a schematic sectional view for describing an example of a method for manufacturing the semiconductor device of the first exemplary embodiment.

A conductive layer made of the constituent material of the second electrode layer 24 is formed on the surface of the dielectric layer 23 on the side opposite to the semiconductor substrate 10 with a sputtering method, for example. Thereafter, the second electrode layer 24 in FIG. 8 is formed by patterning the conductive layer with a combination of a photolithography method and an etching method, for example. More specifically, the second electrode layer 24 is formed to face the first electrode layer 22 with the dielectric layer 23 interposed therebetween.

<Formation of Opening in Dielectric Layer>

Figure 9:
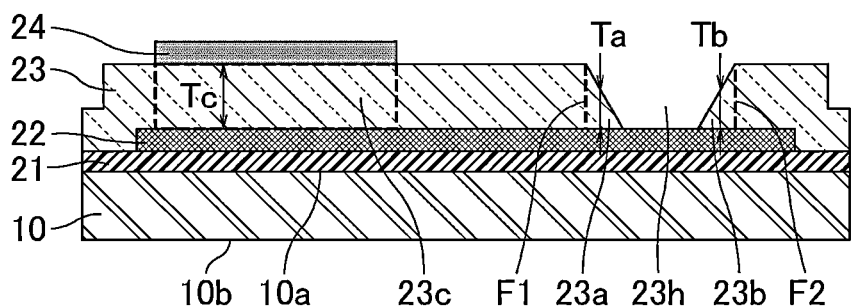
FIG. 9 is a schematic sectional view for describing an example of a method for manufacturing the semiconductor device of the first exemplary embodiment.

In the dielectric layer 23, the opening 23h having a tapered sectional shape and exposing part of the first electrode layer 22 is formed as illustrated in FIG. 9, with an anisotropic etching, for example. In an exemplary aspect, the anisotropic etching above is carried out by performing a plasma etching of the dielectric layer 23 while forming a reactant deposit of a deposition gas on a side wall, for example.

As described above, the end portion 23a of the dielectric layer 23 is in contact with the first electrode layer 22 at the surface on the side of the first electrode layer 22, and has a tapered sectional shape as shown in FIG. 2, for example. Consequently, the size Ta of the end portion 23a in the thickness direction continuously decreases toward the center of the opening 23h. Thus, the size Ta of the end portion 23a of the dielectric layer 23 in the thickness direction is smaller than the size Tc of the inter-electrode portion 23c in the thickness direction.

Further, the end portion 23b of the dielectric layer 23 is in contact with the first electrode layer 22 at the surface on the side of the first electrode layer 22, and has a tapered sectional shape. Consequently, the size Tb of the end portion 23b in the thickness direction continuously decreases toward the center of the opening 23h. Thus, the size Tb of the end portion 23b of the dielectric layer 23 in the thickness direction is smaller than the size Tc of the inter-electrode portion 23c in the thickness direction.

<Formation of Protection Layer>

Figure 10:
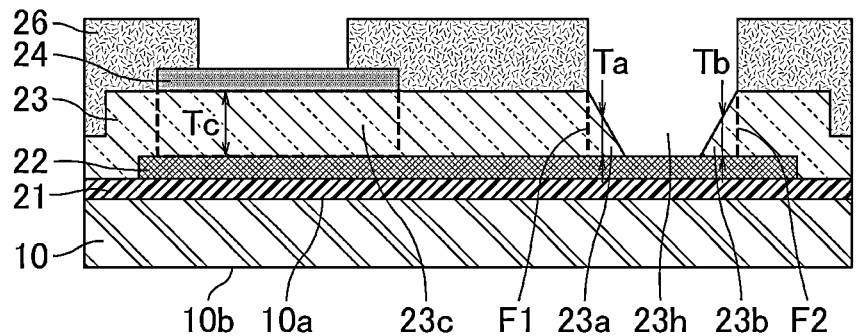
FIG. 10 is a schematic sectional view for describing an example of a method for manufacturing the semiconductor device of the first exemplary embodiment.

A layer made of a constituent material of the protection layer 26 is formed on a surface of a structural body illustrated in FIG. 9 on the side opposite to the semiconductor substrate 10 with a spin coating method, for example. Thereafter, the protection layer 26 in FIG. 10 is formed by patterning the layer with only a photolithography method in an aspect where the constituent material of the protection layer 26 is photosensitive, or with a combination of a photolithography method and an etching method in an aspect where the constituent material of the protection layer 26 is non-photosensitive. More specifically, the protection layer 26 is formed such that openings are respectively provided at a position overlapping with the opening 23h of the dielectric layer 23 for exposing part of the first electrode layer 22, and a position for exposing part of the second electrode layer 24.

<Formation of Outer Electrode>

Figure 11:
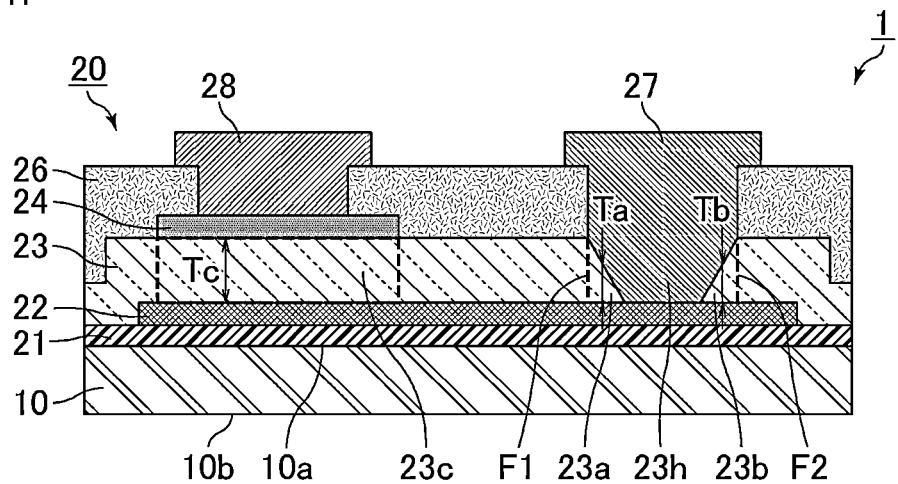
FIG. 11 is a schematic sectional view for describing an example of a method for manufacturing the semiconductor device of the first exemplary embodiment.

As illustrated in FIG. 11, the first outer electrode 27 and the second outer electrode 28 are formed by combining a plating process and a photolithography method, for example.

More specifically, the first outer electrode 27 is formed to be electrically connected to the first electrode layer 22 through the openings respectively provided in the dielectric layer 23 and the protection layer 26. Further, the second outer electrode 28 is formed to be electrically connected to the second electrode layer 24 through the opening provided in the protection layer 26.

As described above, the circuit layer 20 in FIG. 11 is formed on the first main surface 10a of the semiconductor substrate 10. The first outer electrode 27 is drawn out to a position separated from the second outer electrode 28 on the surface of the circuit layer 20 on the side opposite to the semiconductor substrate 10. Further, the second outer electrode 28 is drawn out to a position separated from the first outer electrode 27 on the surface of the circuit layer 20 on the side opposite to the semiconductor substrate 10.

As a result, the semiconductor device 1 in FIG. 2 (FIG. 11) is manufactured.

Hereinabove, a case of manufacturing one semiconductor device 1 according to the first exemplary embodiment has been described. However, it should be appreciated that a plurality of semiconductor devices 1 may be manufactured at the same time by forming a plurality of circuit layers 20 on the first main surface 10a of the same semiconductor substrate 10, and then cutting the semiconductor substrate 10 into individual pieces with, for example, a dicing machine.

In general, the capacitance device of the present invention includes a substrate having a first main surface and a second main surface opposite to each other in a thickness direction and a circuit layer provided on the first main surface of the substrate. The circuit layer includes a first electrode layer provided on a side of the substrate, a second electrode layer provided to face the first electrode layer, a dielectric layer provided between the first electrode layer and the second electrode layer in a sectional view, and a first outer electrode electrically connected to the first electrode layer through a first region in which the dielectric layer is not provided. An end portion of the dielectric layer on a side of the first region is in contact with the first electrode layer at a surface on a side of the first electrode layer, and in the dielectric layer, a size of the end portion in the thickness direction is smaller than a size of an inter-electrode portion positioned between the first electrode layer and the second electrode layer in the thickness direction.

It is noted that the capacitance device of the first exemplary embodiment is the same as the semiconductor device of the first exemplary embodiment except that the type of the substrate to which the circuit layer is provided on the first main surface thereof is not limited to a semiconductor substrate.

In the capacitance device of the first exemplary embodiment, examples of the substrates include a semiconductor substrate made of, for example, Si (silicon) or SiGe (silicon germanium), and in addition to them, a ceramics substrate made of, for example, alumina, a glass ceramic substrate, a glass substrate, and a single-crystal substrate made of, for example, sapphire, MgO (magnesium oxide), or SrTiO (strontium titanate).

In the exemplary capacitance device, as same as in the semiconductor device of the first exemplary embodiment, detachment in the vicinity of an opening of the dielectric layer is also prevented.

Second Exemplary Embodiment

In the semiconductor device of the present invention, in a dielectric layer, a size in a thickness direction of an end portion may decrease stepwise toward a center of an opening. Such an example will be described below as a semiconductor device of a second exemplary embodiment. The semiconductor device of the second exemplary embodiment is the same as the semiconductor device of the first exemplary embodiment except for the structure of the dielectric layer.

Figure 12:
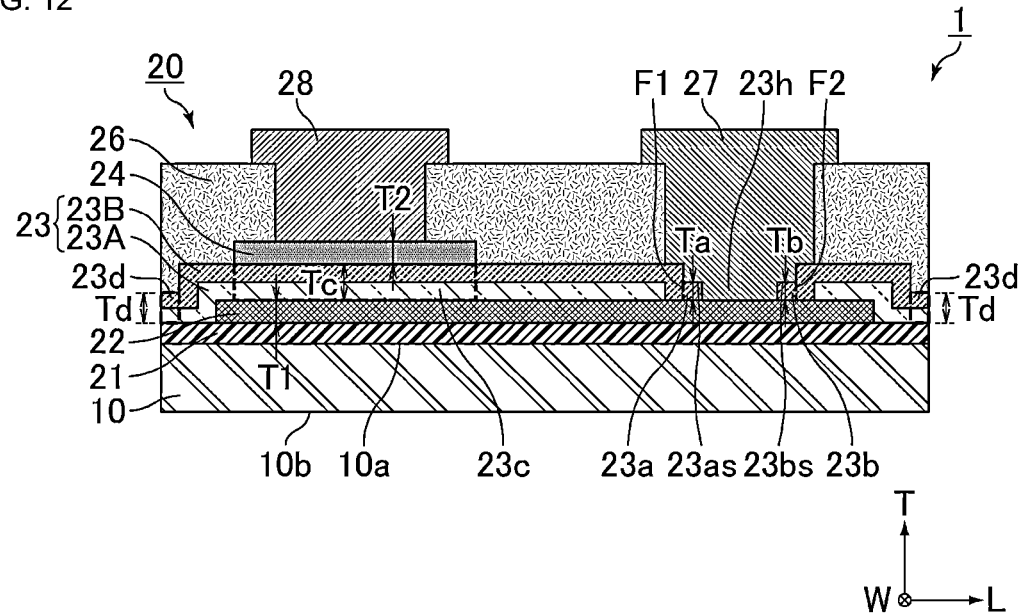
FIG. 12 is a schematic sectional view of a semiconductor device of a second exemplary embodiment.

FIG. 12 is a schematic sectional view of the semiconductor device of the second embodiment.

As illustrated in FIG. 12, an end portion 23a of a dielectric layer 23 on the side of an opening 23h is in contact with the first electrode layer 22 at a surface on the side of the first electrode layer 22.

As shown in the dielectric layer 23, a size Ta of the end portion 23a in the thickness direction T is smaller than a size Tc of the inter-electrode portion 23c in the thickness direction T.

As illustrated in FIG. 12, an end portion 23b of the dielectric layer 23 on the side of the opening 23h is in contact with the first electrode layer 22 at the surface on the side of the first electrode layer 22.

In the dielectric layer 23, a size Tb of the end portion 23b in the thickness direction T is smaller than the size Tc of the inter-electrode portion 23c in the thickness direction T.

The end portion 23a and the end portion 23b of the dielectric layer 23 have the structure described above, and consequently internal stress is lowered. Thus, detachment in the vicinity of the opening 23h of the dielectric layer 23 is prevented.

In the semiconductor device 1 in FIG. 12, in the dielectric layer 23, both the size Ta of the end portion 23a in the thickness direction T and the size Tb of the end portion 23b in the thickness direction T are smaller than the size Tc of the inter-electrode portion 23c in the thickness direction T. However, it is acceptable that either of the size Ta of the end portion 23a in the thickness direction T or the size Tb of the end portion 23b in the thickness direction T is smaller than the size Tc of the inter-electrode portion 23c in the thickness direction T. From a viewpoint of preventing detachment in the vicinity of the opening 23h of the dielectric layer 23, it is preferable that both the size Ta of the end portion 23a in the thickness direction T and the size Tb of the end portion 23b in the thickness direction T be smaller than the size Tc of the inter-electrode portion 23c in the thickness direction T.

First, the end portion 23a of the dielectric layer 23 will be described in detail.

As illustrated in FIG. 12, in the dielectric layer 23, the size Ta of the end portion 23a in the thickness direction T decreases stepwise (e.g., a stepped configuration) toward the center of the opening 23h. More specifically, the end portion 23a of the dielectric layer 23 is in contact with the first electrode layer 22, and the sectional shape of the end portion 23a of the dielectric layer 23 is a staircase shape. In a sectional view illustrated in FIG. 12, a step is disposed between a surface 23as of the end portion 23a of the dielectric layer 23 and a surface of the first electrode layer 22. In this exemplary aspect, there is one step.

In a sectional view illustrated in FIG. 12, the surface 23as of the end portion 23a of the dielectric layer 23 is preferably a flat surface, but may be a surface having a height difference within ±10% of a size of a dielectric layer forming the end portion 23a, here, of a second dielectric layer 23B described later, in the thickness direction T.

The dielectric layer 23 has a multi-layer structure at least in the inter-electrode portion 23c, and in the dielectric layer 23, the number of layers forming the end portion 23a may be smaller than the number of layers forming the inter-electrode portion 23c. In the semiconductor device 1 in FIG. 12, the dielectric layer 23 has a two-layer structure in which a first dielectric layer 23A and the second dielectric layer 23B are laminated in the inter-electrode portion 23c. Further, in the dielectric layer 23, the number of layers forming the end portion 23a is one of the second dielectric layer 23B, and is smaller than two which is the number of layers forming the inter-electrode portion 23c. Since the dielectric layer 23 has the structure described above, it is easy to make a form in which the size Ta of the end portion 23a in the thickness direction T decreases stepwise toward the center of the opening 23h. It is also noted that, in the dielectric layer 23, the end portion 23a may have a multi-layer structure. For example, when the end portion 23a of the dielectric layer 23 has a two-layer structure, the inter-electrode portion 23c needs to have a multi-layer structure having three or more layers.

Next, the end portion 23b of the dielectric layer 23 will be described in detail.

As illustrated in FIG. 12, in the dielectric layer 23, the size Tb of the end portion 23b in the thickness direction T decreases stepwise toward the center of the opening 23h. More specifically, the end portion 23b of the dielectric layer 23 is in contact with the first electrode layer 22, and the sectional shape of the end portion 23b of the dielectric layer 23 is a staircase shape. In a sectional view illustrated in FIG. 12, a step is disposed between a surface 23bs of the end portion 23b of the dielectric layer 23 and the surface of the first electrode layer 22. In this exemplary aspect, there is one step as noted above.

In a sectional view illustrated in FIG. 12, the surface 23bs of the end portion 23b of the dielectric layer 23 is preferably a flat surface, but may be a surface having a height difference within ±10% of a size of a dielectric layer forming the end portion 23b, here, of the second dielectric layer 23B described later, in the thickness direction T.

The dielectric layer 23 has a multi-layer structure at least in the inter-electrode portion 23c, and in the dielectric layer 23, the number of layers forming the end portion 23b may be smaller than the number of layers forming the inter-electrode portion 23c. In the semiconductor device 1 in FIG. 12, the dielectric layer 23 has a two-layer structure in which the first dielectric layer 23A and the second dielectric layer 23B are laminated in the inter-electrode portion 23c. Further, in the dielectric layer 23, the number of layers forming the end portion 23b is one of the second dielectric layer 23B, and is smaller than two which is the number of layers forming the inter-electrode portion 23c. Since the dielectric layer 23 has the structure described above, it is easy to make a form in which the size Tb of the end portion 23b in the thickness direction T decreases stepwise toward the center of the opening 23h. It is also noted that, in the dielectric layer 23, the end portion 23b may have a multi-layer structure. For example, when the end portion 23b of the dielectric layer 23 has a two-layer structure, the inter-electrode portion 23c needs to have a multi-layer structure having three or more layers.

Hereinafter, a case that the dielectric layer 23 has a multi-layer structure will be described.

A plurality of layers included in the multi-layer structure of the dielectric layer 23 may be made of the same material in an exemplary aspect. In the semiconductor device 1 in FIG. 12, the first dielectric layer 23A and the second dielectric layer 23B may be made of the same material. The same material above is preferably selected from the group consisting of SiN (silicon nitride), $SiO_2$ (silicon oxide), SiON (silicon oxynitride), $Al_2O_3$ (aluminum oxide), $HfO_2$ (hafnium oxide), and $Ta_2O_5$ (tantalum oxide).

In an aspect where a plurality of layers included in the multi-layer structure of the dielectric layer 23 are made of the same material, here, in a case that the first dielectric layer 23A and the second dielectric layer 23B are made of the same material, an interface between the first dielectric layer 23A and the second dielectric layer 23B made of the same material may be confirmed by observing a section as illustrated in FIG. 12 with a transmission electron microscope (TEM).

The plurality of layers included in the multi-layer structure of the dielectric layer 23 may be made of different materials. In the semiconductor device 1 in FIG. 12, the first dielectric layer 23A and the second dielectric layer 23B may be made of different materials. The different material above is preferably selected from the group consisting of SiN (silicon nitride), $SiO_2$ (silicon oxide), SiON (silicon oxynitride), $Al_2O_3$ (aluminum oxide), $HfO_2$ (hafnium oxide), and $Ta_2O_5$ (tantalum oxide).

In an aspect where the plurality of layers included in the multi-layer structure of the dielectric layer 23 are made of different materials, in the dielectric layer 23, it is preferable that the layer of the inter-electrode portion 23c on the side of the first electrode layer 22 be made of $SiO_2$ (silicon oxide), and the layer of the end portion 23a on the side of the first electrode layer 22 be made of SiN (silicon nitride). In the semiconductor device 1 in FIG. 12, in the dielectric layer 23, it is preferable that the layer of the inter-electrode portion 23c on the side of the first electrode layer 22, that is, the first dielectric layer 23A be made of $SiO_2$ (silicon oxide), and the layer of the end portion 23a on the side of the first electrode layer 22, that is, the second dielectric layer 23B be made of SiN (silicon nitride).

In an aspect where the plurality of layers included in the multi-layer structure of the dielectric layer 23 are made of different materials, in the dielectric layer 23, it is preferable that the layer of the inter-electrode portion 23c on the side of the first electrode layer 22 be made of $SiO_2$ (silicon oxide), and the layer of the end portion 23b on the side of the first electrode layer 22 be made of SiN (silicon nitride). In the semiconductor device 1 in FIG. 12, in the dielectric layer 23, it is preferable that the layer of the inter-electrode portion 23c on the side of the first electrode layer 22, that is, the first dielectric layer 23A be made of $SiO_2$ (silicon oxide), and the layer of the end portion 23b on the side of the first electrode layer 22, that is, the second dielectric layer 23B be made of SiN (silicon nitride).

Since the multi-layer structure of the dielectric layer 23 is made of the materials described above, thermal expansion coefficients of a portion of the dielectric layer 23 on the side of the first electrode layer 22 and the first electrode layer 22 are likely to be close to each other. Thus, detachment between the dielectric layer 23 and the first electrode layer 22 is sufficiently prevented.

It is noted that the number of steps of each of the end portion 23a and the end portion 23b of the dielectric layer 23 may be one as illustrated in FIG. 12, or two or more in alternative aspects.

Figure 13:
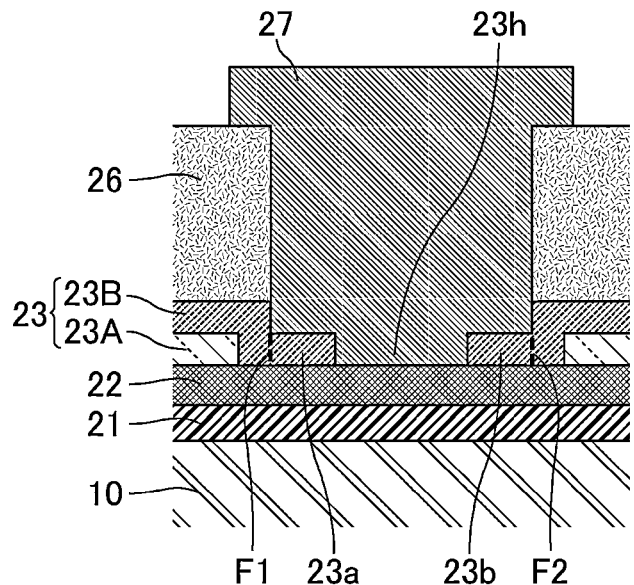
FIG. 13 is a schematic sectional view of another form example of an end portion of a dielectric layer in FIG. 12.
Figure 14:
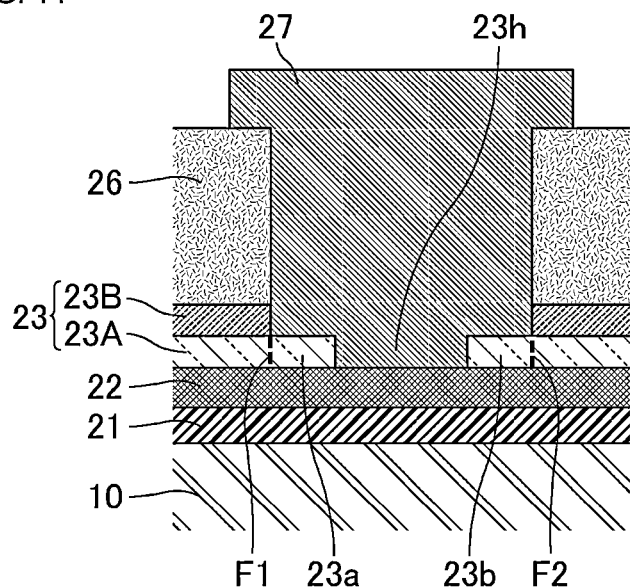
FIG. 14 is a schematic sectional view of still another form example of the end portion of the dielectric layer in FIG. 12.

More particularly, the end portion 23a and end portion 23b of the dielectric layer 23 may have a structure as illustrated in FIG. 13 or FIG. 14.

FIG. 13 is a schematic sectional view of another form example of the end portion of the dielectric layer in FIG. 12. In FIG. 13, the vicinity of the opening of the dielectric layer is illustrated. In the dielectric layer 23 in FIG. 13, the second dielectric layer 23B covers up to a side surface of the first dielectric layer 23A. This configuration prevents damage to the first dielectric layer 23A when the second dielectric layer 23B is formed. Further, each of the first dielectric layer 23A and the second dielectric layer 23B is not restricted in the constituent materials, and may be made of the same material or different materials. In the end portion 23a and the end portion 23b of the dielectric layer 23 in FIG. 13, detachment is also prevented in the same manner as the end portion 23a and the end portion 23b of the dielectric layer 23 in FIG. 12.

FIG. 14 is a schematic sectional view of still another form example of the end portion of the dielectric layer in FIG. 12. In FIG. 14, the vicinity of the opening of the dielectric layer is illustrated. In the dielectric layer 23 in FIG. 14, the second dielectric layer 23B does not cover up to the side surface of the first dielectric layer 23A. This configuration may pose damage to the first dielectric layer 23A when the second dielectric layer 23B is formed. Further, the first dielectric layer 23A and the second dielectric layer 23B respectively have restrictions in constituent materials and need to be made of different materials. In the end portion 23a and the end portion 23b of the dielectric layer 23 in FIG. 14, detachment is also prevented in the same manner as the end portion 23a and the end portion 23b of the dielectric layer 23 in FIG. 12.

The semiconductor device 1 in FIG. 12 is manufactured with the following method, for example. FIGS. 15-23 are schematic sectional views for describing an example of a method for manufacturing the semiconductor device of the second exemplary embodiment.

<Formation of Insulation Layer>

Figure 15:
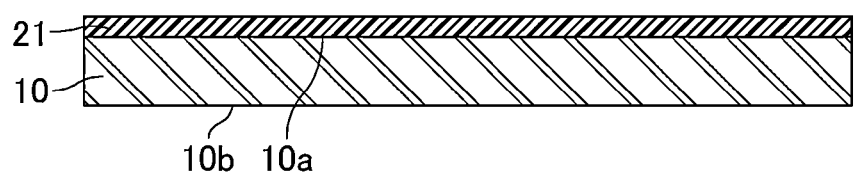
FIG. 15 is a schematic sectional view for describing an example of a method for manufacturing the semiconductor device of the second exemplary embodiment.

As illustrated in FIG. 15, the insulation layer 21 is formed on the first main surface 10a of the semiconductor substrate 10 with a thermal oxidization method, a sputtering method, or a chemical vapor deposition method, for example.

<Formation of First Electrode Layer>

Figure 16:
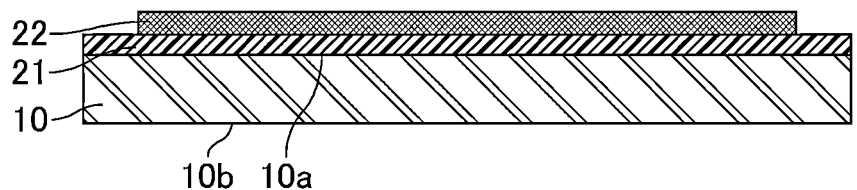
FIG. 16 is a schematic sectional view for describing an example of a method for manufacturing the semiconductor device of the second exemplary embodiment.

Moreover, a conductive layer made of the constituent material of the first electrode layer 22 is formed on the surface of the insulation layer 21 on the side opposite to the semiconductor substrate 10 with a sputtering method, for example. Thereafter, the first electrode layer 22 is formed as illustrated in FIG. 16 by patterning the conductive layer with a combination of a photolithography method and an etching method. More specifically, the first electrode layer 22 is formed up to a position separated from the end portion of the semiconductor substrate 10.

<Formation of First Dielectric Layer>

Figure 17:
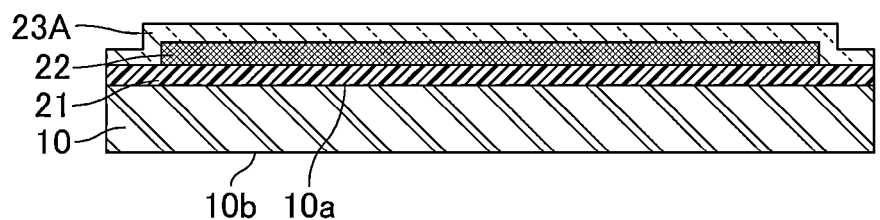
FIG. 17 is a schematic sectional view for describing an example of a method for manufacturing the semiconductor device of the second exemplary embodiment.

As illustrated in FIG. 17, the first dielectric layer 23A is formed to cover the first electrode layer 22 with a sputtering method or a chemical vapor deposition method, for example.

<Formation of Opening in First Dielectric Layer>

The first dielectric layer 23A is patterned with a combination of a photolithography method and an etching method, for example. With this, as illustrated in FIG. 18, an opening for exposing part of the first electrode layer 22 is formed in the first dielectric layer 23A.

<Formation of Second Dielectric Layer>

Figure 18:
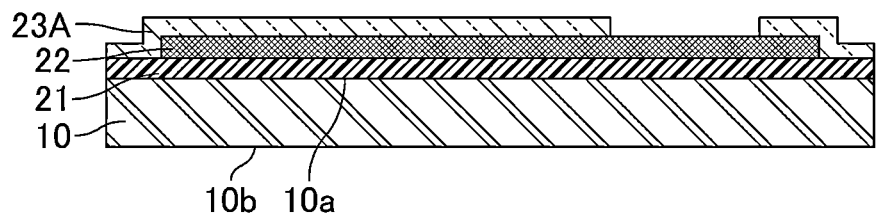
FIG. 18 is a schematic sectional view for describing an example of a method for manufacturing the semiconductor device of the second exemplary embodiment.
Figure 19:
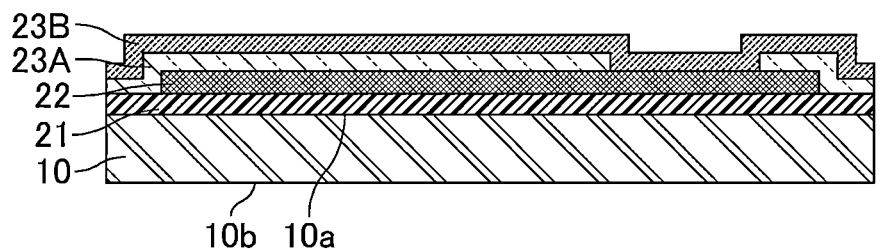
FIG. 19 is a schematic sectional view for describing an example of a method for manufacturing the semiconductor device of the second exemplary embodiment.

As illustrated in FIG. 19, the second dielectric layer 23B is formed on a surface of a structural body in FIG. 18 on the side opposite to the semiconductor substrate 10 with a sputtering method or a chemical vapor deposition method.

<Formation of Second Electrode Layer>

Figure 20:
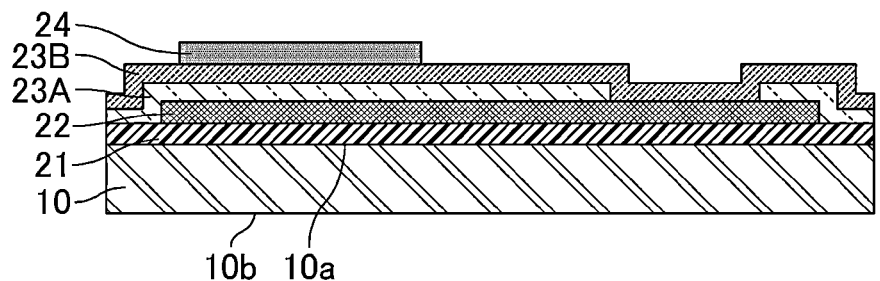
FIG. 20 is a schematic sectional view for describing an example of a method for manufacturing the semiconductor device of the second exemplary embodiment.

A conductive layer made of the constituent material of the second electrode layer 24 is formed on a surface of the second dielectric layer 23B on the side opposite to the semiconductor substrate 10 with a sputtering method, for example. Thereafter, the second electrode layer 24 in FIG. 20 is formed by patterning the conductive layer with a combination of a photolithography method and an etching method, for example. More specifically, the second electrode layer 24 is formed to face the first electrode layer 22 with the first dielectric layer 23A and the second dielectric layer 23B interposed therebetween.

<Formation of Opening in Second Dielectric Layer>

Figure 21:
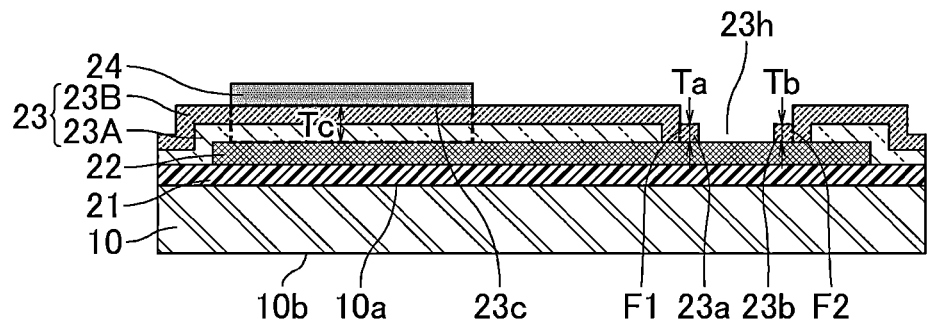
FIG. 21 is a schematic sectional view for describing an example of a method for manufacturing the semiconductor device of the second exemplary embodiment.

The second dielectric layer 23B is patterned with a combination of a photolithography method and an etching method, for example. With this, as illustrated in FIG. 21, an opening is formed in the second dielectric layer 23B for exposing part of the first electrode layer 22 in an opening of the first dielectric layer 23A.

As described above, the end portion 23a of the dielectric layer 23 is in contact with the first electrode layer 22 at the surface on the side of the first electrode layer 22, and the sectional shape thereof is a staircase shape. The size Ta of the end portion 23a of the dielectric layer 23 in the thickness direction is smaller than the size Tc of the inter-electrode portion 23c in the thickness direction.

Further, the end portion 23b of the dielectric layer 23 is in contact with the first electrode layer 22 at the surface on the side of the first electrode layer 22, and the sectional shape thereof is a staircase shape in the exemplary aspect. The size Tb of the end portion 23b of the dielectric layer 23 in the thickness direction is smaller than the size Tc of the inter-electrode portion 23c in the thickness direction.

As described above, in an aspect where the dielectric layer 23 is formed by laminating the first dielectric layer 23A and the second dielectric layer 23B, it is preferable that one of the first dielectric layer 23A and the second dielectric layer 23B be formed to leave internal stress directing to an outer side portion in the length direction, and the other be formed to leave internal stress directing to an inner side portion in the length direction. By forming the first dielectric layer 23A and the second dielectric layer 23B as described above, internal stress of the first dielectric layer 23A and internal stress of the second dielectric layer 23B are likely to cancel each other, and this configuration contributes to prevention of detachment of the dielectric layer 23.

<Formation of Protection Layer>

Figure 22:
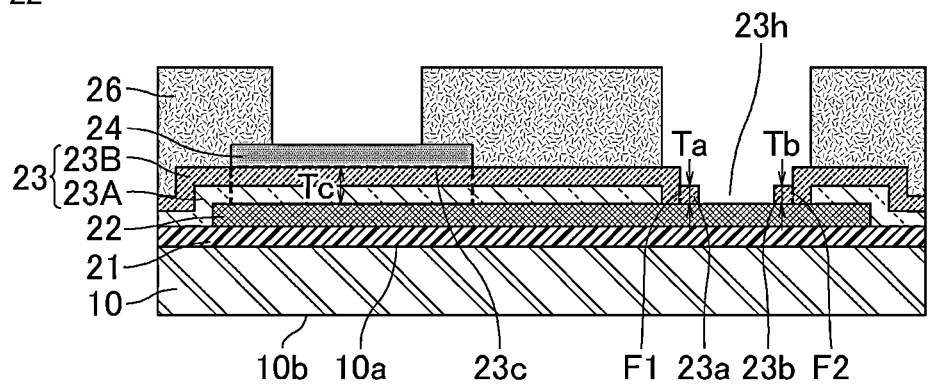
FIG. 22 is a schematic sectional view for describing an example of a method for manufacturing the semiconductor device of the second exemplary embodiment.

A layer made of a constituent material of the protection layer 26 is formed on a surface of a structural body illustrated in FIG. 21 on the side opposite to the semiconductor substrate 10 with a spin coating method, for example. Thereafter, the protection layer 26 in FIG. 22 is formed by patterning the layer with only a photolithography method in a case that the constituent material of the protection layer 26 is photosensitive, or with a combination of a photolithography method and an etching method in a case that the constituent material of the protection layer 26 is non-photosensitive. More specifically, the protection layer 26 is formed such that openings are respectively provided at a position overlapping with the opening 23h of the dielectric layer 23 for exposing part of the first electrode layer 22, and a position for exposing part of the second electrode layer 24.

<Formation of Outer Electrode>

Figure 23:
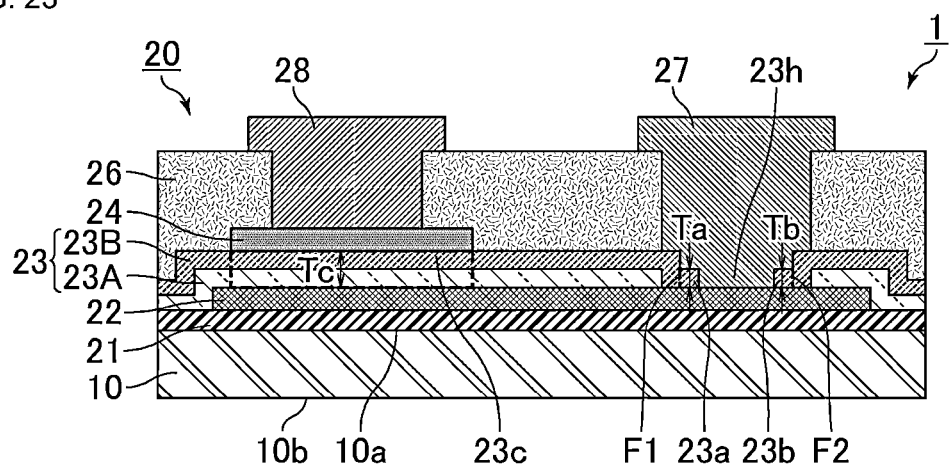
FIG. 23 is a schematic sectional view for describing an example of a method for manufacturing the semiconductor device of the second exemplary embodiment.

As illustrated in FIG. 23, the first outer electrode 27 and the second outer electrode 28 are formed by combining a plating process and a photolithography method, for example. More specifically, the first outer electrode 27 is formed to be electrically connected to the first electrode layer 22 through the openings respectively provided in the dielectric layer 23 and the protection layer 26. Further, the second outer electrode 28 is formed to be electrically connected to the second electrode layer 24 through the opening provided in the protection layer 26.

As described above, the circuit layer 20 in FIG. 23 is formed on the first main surface 10a of the semiconductor substrate 10. The first outer electrode 27 is drawn out to a position separated from the second outer electrode 28 on the surface of the circuit layer 20 on the side opposite to the semiconductor substrate 10. Further, the second outer electrode 28 is drawn out to a position separated from the first outer electrode 27 on the surface of the circuit layer 20 on the side opposite to the semiconductor substrate 10.

As a result, the semiconductor device 1 in FIG. 12 (FIG. 23) is manufactured.

The capacitance device of the second exemplary embodiment is the same as the semiconductor device of the second exemplary embodiment except that the type of the substrate to which the circuit layer is provided on the first main surface thereof is not limited to a semiconductor substrate.

Examples of the substrates in the capacitance device of the second exemplary embodiment include the same substrates as those in the capacitance device of the first exemplary embodiment described above.

In the capacitance device of the second exemplary embodiment, as same as in the semiconductor device of the second exemplary embodiment, detachment in the vicinity of an opening of a dielectric layer is also prevented.

In the semiconductor device of the first exemplary embodiment, the capacitance device of the first exemplary embodiment, the semiconductor device of the second exemplary embodiment, and the capacitance device of the second exemplary embodiment, the first outer electrode and the first electrode layer are electrically connected through the opening provided in the dielectric layer. However, in alternative aspects, it is acceptable that the first outer electrode and the first electrode layer are electrically connected through the first region in which no dielectric layer is provided, not restricted to being electrically connected through the opening in the dielectric layer. For example, in the semiconductor device 1 in FIG. 2, the capacitor element may be formed as long as the dielectric layer 23 is present at least in the inter-electrode portion 23c. This configuration makes it unnecessary that the dielectric layer 23 extends up to the side of the first outer electrode 27. In the case above, the end portion 23a of the dielectric layer 23 is separated from the first outer electrode 27 with the protection layer 26, and may be in contact with the inter-electrode portion 23c. Further, since no opening is provided in the dielectric layer 23, there is no end portion 23b.

REFERENCE SIGNS LIST

1 SEMICONDUCTOR DEVICE
10 SEMICONDUCTOR SUBSTRATE
10a FIRST MAIN SURFACE OF SEMICONDUCTOR SUBSTRATE
10b SECOND MAIN SURFACE OF SEMICONDUCTOR SUBSTRATE
20 CIRCUIT LAYER
21 INSULATION LAYER
22 FIRST ELECTRODE LAYER
23 DIELECTRIC LAYER
23a, 23b END PORTION OF DIELECTRIC LAYER
23as, 23bs SURFACE OF END PORTION OF DIELECTRIC LAYER
23c INTER-ELECTRODE PORTION OF DIELECTRIC LAYER
23d OUTER PERIPHERAL EDGE PORTION OF DIELECTRIC LAYER

23h OPENING (FIRST REGION) OF DIELECTRIC LAYER
23A FIRST DIELECTRIC LAYER
23B SECOND DIELECTRIC LAYER
24 SECOND ELECTRODE LAYER
26 PROTECTION LAYER
27 FIRST OUTER ELECTRODE
28 SECOND OUTER ELECTRODE
D DIAMETER OF OPENING IN DIELECTRIC LAYER
F1, F2 DOTTED LINE
L LENGTH DIRECTION
La, Lb DISTANCE IN LENGTH DIRECTION BETWEEN A POSITION WHERE SIZE IN THICKNESS DIRECTION OF A TAPERED SHAPE IS ZERO AND A POSITION WHERE SIZE IN THICKNESS DIRECTION OF THE TAPERED SHAPE IS MAXIMUM
T THICKNESS DIRECTION
Ta, Tb SIZE OF END PORTION OF DIELECTRIC LAYER IN THICKNESS DIRECTION
Tc SIZE OF INTER-ELECTRODE PORTION OF DIELECTRIC LAYER IN THICKNESS DIRECTION
Td SIZE OF OUTER PERIPHERAL EDGE PORTION OF DIELECTRIC LAYER IN THICKNESS DIRECTION
T1 SIZE OF FIRST ELECTRODE LAYER IN THICKNESS DIRECTION
T2 SIZE OF SECOND ELECTRODE LAYER IN THICKNESS DIRECTION
W WIDTH DIRECTION
θa, θb INCLINATION ANGLE OF TAPERED SHAPE

The invention claimed is:

1. A semiconductor device comprising:
a semiconductor substrate having a first main surface and a second main surface opposite to each other in a thickness direction; and
a circuit layer disposed on the first main surface of the semiconductor substrate and including:
a first electrode layer disposed on a side of the semiconductor substrate,
a second electrode layer disposed to face the first electrode layer,
a dielectric layer disposed between the first and second electrode layers in a sectional view,
a first outer electrode electrically connected to the first electrode layer through a first region where the dielectric layer is not disposed, the first region being an opening disposed in the dielectric layer, and
a second outer electrode electrically connected to the second electrode layer,
wherein an end portion of the dielectric layer on a side of the first region is in contact with the first electrode layer at a surface of the first electrode layer,
wherein, in the dielectric layer, a size of the end portion in the thickness direction is smaller than a size of an inter-electrode portion disposed between the first electrode layer and the second electrode layer in the thickness direction,
wherein the end portion of the dielectric layer is an edge that surrounds the opening,
wherein the size of the end portion of the dielectric layer in the thickness direction continuously decreases towards a center of the opening, such that a sectional shape of the end portion of the dielectric layer is a tapered shape, and
wherein a distance between a position at which a size of the tapered shape in the thickness direction is zero and a position at which the size is maximum, in a length direction from the second outer electrode toward the first outer electrode, is 1% or more of a diameter of the opening.

2. The semiconductor device according to claim 1, wherein a size of the end portion of the dielectric layer on a side of the opening in the thickness direction is smaller than a size of the end portion of the dielectric layer on a side opposite to the opening in the thickness direction.

3. The semiconductor device according to claim 1, wherein the size of the end portion of the dielectric layer in the thickness direction decreases stepwise towards a center of the opening.

4. The semiconductor device according to claim 1, wherein an inclination angle of the tapered shape is 30° or more and 60° or less.

5. The semiconductor device according to claim 1, further comprising:
a second outer electrode electrically connected to the second electrode layer,
wherein a distance between a position at which a size of the tapered shape in the thickness direction is zero and a position at which the size is maximum, in a length direction from the second outer electrode toward the first outer electrode, is 50% or more of the size of the inter-electrode portion in the thickness direction.

6. The semiconductor device according to claim 1, wherein, in the dielectric layer, a size of an outer peripheral edge positioned at an outer peripheral edge of the circuit layer in the thickness direction is smaller than the size of the inter-electrode portion in the thickness direction.

7. The semiconductor device according to claim 1, wherein the size of the inter-electrode portion of the dielectric layer in the thickness direction is at least 1 μm.

8. The semiconductor device according to claim 1, wherein the size of the inter-electrode portion of the dielectric layer in the thickness direction is equal to or larger than a size of the first electrode layer in the thickness direction or a size of the second electrode layer in the thickness direction.

9. A semiconductor device comprising:
a semiconductor substrate having a first main surface and a second main surface opposite to each other in a thickness direction; and
a circuit layer disposed on the first main surface of the semiconductor substrate and including:
a first electrode layer disposed on a side of the semiconductor substrate,
a second electrode layer disposed to face the first electrode layer,
a dielectric layer disposed between the first and second electrode layers in a sectional view, and
a first outer electrode electrically connected to the first electrode layer through a first region where the dielectric layer is not disposed,
wherein an end portion of the dielectric layer on a side of the first region is in contact with the first electrode layer at a surface of the first electrode layer, and
wherein, in the dielectric layer, a size of the end portion in the thickness direction is smaller than a size of an inter-electrode portion disposed between the first electrode layer and the second electrode layer in the thickness direction,
wherein the first region is an opening disposed in the dielectric layer, and the end portion of the dielectric layer is an edge that surrounds the opening, wherein the size of the end portion of the dielectric layer in the thickness direction decreases stepwise towards a center of the opening, wherein the dielectric layer has a multi-layer structure at least in the inter-electrode portion, and wherein, in the dielectric layer, a number of layers forming the end portion is smaller than the number of layers forming the inter-electrode portion.

10. The semiconductor device according to claim 9, wherein the number of layers forming the end portion of the dielectric layer is one.

11. The semiconductor device according to claim 9, wherein a plurality of layers included in the multi-layer structure of the dielectric layer comprises a same material.

12. The semiconductor device according to claim 9, wherein a plurality of layers included in the multi-layer structure of the dielectric layer comprises different materials from one another.

13. The semiconductor device according to claim 12, wherein the different materials are selected from a group consisting of SiN, $SiO_2$, SiON, $Al_2O_3$, $HfO_2$, and $Ta_2O_5$.

14. The semiconductor device according to claim 13, wherein, in the dielectric layer, a layer of the inter-electrode portion on the side of the first electrode layer comprises $SiO_2$, and a layer of the end portion on the side of the first electrode layer comprises SiN.

15. A capacitance device comprising:
a substrate having a first main surface and a second main surface opposite to each other in a thickness direction; and
a circuit layer disposed on the first main surface of the substrate and including:
a first electrode layer disposed on a side of the substrate,
a second electrode layer disposed to face the first electrode layer,
a dielectric layer disposed between the first electrode layer and the second electrode layer in a sectional view,
a first outer electrode electrically connected to the first electrode layer through a first region where the dielectric layer is not disposed, and
a second outer electrode electrically connected to the second electrode layer,
wherein an end portion of the dielectric layer on a side of the first region is in contact with the first electrode layer at a surface of the first electrode layer, and
wherein, in the dielectric layer, a size of the end portion in the thickness direction is smaller than a size of an inter-electrode portion disposed between the first electrode layer and the second electrode layer in the thickness direction, wherein the first region is an opening disposed in the dielectric layer, and the end portion of the dielectric layer is an edge that surrounds the opening, wherein the size of the end portion of the dielectric layer in the thickness direction continuously decreases towards a center of the opening in a tapered configuration, such that a sectional shape of the end portion of the dielectric layer is a tapered shape, and wherein a distance between a position at which a size of the tapered shape in the thickness direction is zero and a position at which the size is maximum, in a length direction from the second outer electrode toward the first outer electrode, is 1% or more of a diameter of the opening.

16. The capacitance device according to claim 15, wherein a size of the end portion of the dielectric layer on a side of the opening in the thickness direction is smaller than a size of the end portion of the dielectric layer on a side opposite to the opening in the thickness direction.

17. The capacitance device according to claim 15, wherein an inclination angle of the tapered shape is 30° or more and 60° or less.

18. The capacitance device according to claim 15, wherein a distance between a position at which a size of the tapered shape in the thickness direction is zero and a position at which the size is maximum, in a length direction from the second outer electrode toward the first outer electrode, is 50% or more of the size of the inter-electrode portion in the thickness direction.

19. The capacitance device according to claim 15, wherein, in the dielectric layer, a size of an outer peripheral edge positioned at an outer peripheral edge of the circuit layer in the thickness direction is smaller than the size of the inter-electrode portion in the thickness direction.

20. The capacitance device according to claim 15, wherein the size of the inter-electrode portion of the dielectric layer in the thickness direction is at least 1 μm.

21. The capacitance device according to claim 15, wherein the size of the inter-electrode portion of the dielectric layer in the thickness direction is equal to or larger than a size of the first electrode layer in the thickness direction or a size of the second electrode layer in the thickness direction.

* * * * *